United States Patent [19]
Yiannoulos

[11] Patent Number: 5,969,337
[45] Date of Patent: Oct. 19, 1999

[54] INTEGRATED PHOTOSENSING DEVICE FOR ACTIVE PIXEL SENSOR IMAGERS

[75] Inventor: Aris Antony Yiannoulos, Wyomissing Hills, Pa.

[73] Assignee: Lucent Technologies Inc., Murray Hill, N.J.

[21] Appl. No.: 08/846,967

[22] Filed: Apr. 29, 1997

[51] Int. Cl.⁶ .................................................. H01L 31/04
[52] U.S. Cl. .................... 250/214.1; 250/208.1; 257/292
[58] Field of Search .............................. 250/214.1, 208.1; 257/292, 291, 290

[56] References Cited

U.S. PATENT DOCUMENTS

| | | | |
|---|---|---|---|
| 3,805,062 | 4/1974 | Michon et al. | 257/231 |
| 5,329,112 | 7/1994 | Mihara | 250/208.1 |
| 5,471,515 | 11/1995 | Fossum et al. | 377/60 |
| 5,625,210 | 4/1997 | Lee et al. | 257/292 |
| 5,708,263 | 1/1998 | Wong | 250/208.1 |
| 5,721,425 | 2/1998 | Merrill | 250/214.1 |
| 5,789,774 | 8/1998 | Merrill | 257/292 |

*Primary Examiner*—Edward P. Westin
*Assistant Examiner*—Thanh X. Luu

[57] ABSTRACT

An integrated photosensing device includes a three-terminal photosensing device integrated within a photo-integrator semiconductor integrated circuit. The photosensing device includes a Metal-Oxide-Semiconductor (MOS) capacitor merged with a junction diode, both of which are integrated on a semiconductor substrate. The photo-integrator semiconductor integrated circuit includes a voltage buffer and a number of switches for configuring the photo-integrator during an operating cycle that includes three phases. The circuit resets during the first phase and integrates during the second phase. During the third phase, the circuit forces the output impedance of the photosensing device to increase such that the signal output of the circuit is boosted. Various embodiments are described for the present invention which disclose several buffer and switch configurations for buffering the output and providing the bias requirements of the photosensing device. In one such embodiment, the voltage buffer is implemented as a source-follower circuit having an output voltage that is used to bias the MOS capacitor of the photosensing device into accumulation as opposed to using a fixed bias source. In another embodiment, an additional switch is included to separate the output node of the photo-integrator circuit into two separate node portions. These node portions are used to time share certain elements of the photo-integrator circuit when used in imaging arrays having multiple sites.

26 Claims, 2 Drawing Sheets

INTEGRATED PHOTOSENSING DEVICE FOR ACTIVE PIXEL SENSOR IMAGERS

CROSS REFERENCES TO RELATED APPLICATIONS

This application is related to another U.S. patent application, Ser. No. 08/846,769 entitled "PHOTOSENSING DEVICE WITH IMPROVED SPECTRAL RESPONSE AND LOW THERMAL LEAKAGE" (YIANNOULOS-9), having a filing date of Apr. 30, 1997, having a common inventor and assignee and being incorporated herein by reference.

FIELD OF THE INVENTION

This invention relates generally to photosensing applications, and more particularly to an integrated photosensing semiconductor device for Active Pixel Sensor (APS) imaging arrays.

BACKGROUND OF THE INVENTION

The market trends for solid state image sensor technology represents a sales potential exceeding a billion dollars, with device sales many times that figure. Established markets for the technology include space based sensors, computer multimedia devices, video phones, toys, cameras, surveillance equipment, automotive, personal imaging equipment, x-ray imaging, manufacturing inspection, and telemedicine. Initial strides in the solid state image sensor technology resided with the silicon charge-coupled device (CCD) technology. More recently Active Pixel Sensor (APS) array technology is being pursued as an alternative to CCD array technology in the established markets. Unlike CCD technology, APS technology is compatible with standard VLSI (Very Large Scale Integration) fabrication technologies. This compatibility presents opportunities for integrating imaging arrays and vast signal processing functionality on a single silicon chip. APS technology is also free of the fundamental scaling limitations that have prevented CCD technology from producing the very large imaging arrays required for high resolution imaging.

For APS imagers, those skilled in the art recognize the advantages of using arrays of photosensing devices that produce signal output in voltage form rather than in current form. Additionally, the level of the voltage signal produced per unit device area should be high in APS imager applications. If the level of the output signal is low, a voltage amplifier (scaling) circuit must be included at each pixel site, which results in an increase in pixel site area and a lower available signal to noise ratio. More generally, the level of output desired from the photosensing device is a level that matches the dynamic range capabilities of the circuit which subsequently processes the signal. To achieve this match, the prior art devices require boosting the output of the photosensing device with a cascode-type amplifier stage. As is well known, a cascode-type amplifier stage is a single transistor circuit acting as an impedance transformer. However, this approach suffers the disadvantages of added area at each pixel site and an undesirable special bias voltage line running across the array to reach each cascode site. Moreover, the cascode-type amplifier stage used in prior art APS arrays degrades the signal to noise ratio and places a compromising limit on the level of bias that can be applied across the photosensing device.

Accordingly, there is a need for an integrated photosensing device for Active Pixel Sensor (APS) imagers that overcomes the shortcomings of the prior art devices which utilize cascode-type amplifier stages.

SUMMARY OF THE INVENTION

In accordance with the present invention, an integrated photosensing device is provided that includes a photosensing device integrated within a photo-integrator semiconductor integrated circuit. The photosensing device includes a Metal-Oxide-Semiconductor (MOS) capacitor merged with a junction diode, both of which are integrated on a semiconductor substrate. The photo-integrator semiconductor integrated circuit includes a voltage buffer (typically unity gain) and a number of switches for configuring the photo-integrator during an operating cycle that includes a reset phase, an integrating phase, and a read-out phase.

The photosensing device is a three terminal device, including a body terminal, a gate terminal, and a diode terminal. The body terminal contacts a region of the substrate common to both the MOS capacitor and the junction diode. The gate terminal contacts a field plate feature of the MOS capacitor. The diode terminal contacts a diffused feature layer of the junction diode.

The integrated photosensing device typically operates with the body terminal connected to ground (i.e., the photo-integrator circuit's signal and bias reference node). During the reset phase and while the MOS capacitor is biased into accumulation, the junction diode is reverse biased by temporarily connecting the diode terminal to a voltage source. The MOS capacitor is then biased either into depletion or inversion by connecting the gate terminal to a voltage consistent with the voltage connected to the diode terminal and consistent with a threshold voltage of the MOS capacitor. At the onset and for the duration of the integrating phase, both the diode terminal and the gate terminal are floated. At the onset of the read-out phase, the gate terminal is biased so as to force the MOS capacitor into accumulation, at which time the voltage developing between the diode terminal and ground is read out.

The voltage buffer serves to isolate the output of the device from the loading effects of the read-out circuitry. The above method of operation results in boosting the value of the voltage between the diode terminal and ground available during the read-out phase, relative to the value of the same voltage at the end of the integrating phase of the cycle. The ratio of these two voltage values (i.e., gain ratio) is a design parameter and is defined by the ratio of the area of the junction diode to the total area of the entire device. Therefore, the desired amplifying effect provided by the cascode-type amplifier stage in the prior art devices can be exactly attained with the present invention by sizing the junction diode appropriately. For example, the junction diode can be sized so that the impedance of the junction diode equals the output impedance of the cascode amplifier stage that would otherwise be used.

Various embodiments are described for the present invention which disclose several buffer and switch configurations for buffering the output and providing the bias requirements of the photosensing device. In one such embodiment, the voltage buffer is implemented as a source-follower circuit which includes a Metal-Oxide-Semiconductor Field Effect Transistor (MOSFET) and a current-source load. An output voltage from the source-follower circuit is used to bias the MOS capacitor of the photosensing device into accumulation, thus resulting in considerable power savings through the elimination of the requirement for a fixed bias source.

In another embodiment, an additional switch is included to separate the output node of the photo-integrator circuit into two separate node portions. These separate node portions can be advantageously used to time share certain elements of the photo-integrator circuit, which is particularly significant in imaging arrays where multiple sites can be serviced more effectively.

Accordingly, the present invention provides an integrated photosensing device for Active Pixel Sensor (APS) imagers which provides the desired buffered output while advantageously eliminating the need for cascode-type amplifier stages.

BRIEF DESCRIPTION OF THE DRAWINGS

A more complete understanding of the present invention may be obtained from consideration of the following detailed description in conjunction with the drawings, wherein like elements or features have like references, in which.

DETAILED DESCRIPTION OF VARIOUS ILLUSTRATIVE EMBODIMENTS

Although the present invention is particularly well suited for use in active pixel sensor (APS) technology applications, and shall be described with respect to these applications, the device disclosed herein can be used in various other types of photosensing and photo-integrating applications.

As will be described in more detail, an integrated photosensing device is provided which includes a photosensing device integrated within a photo-integrator semiconductor integrated circuit. The photosensing device includes a Metal-Oxide-Semiconductor (MOS) capacitor merged with a junction diode, both of which are integrated on a semiconductor substrate. The photo-integrator circuit includes a voltage buffer (typically unity gain) and a number of switches for configuring the photo-integrator during an operating cycle that includes a reset phase, an integrating phase, and a read-out phase.

Figure 1:
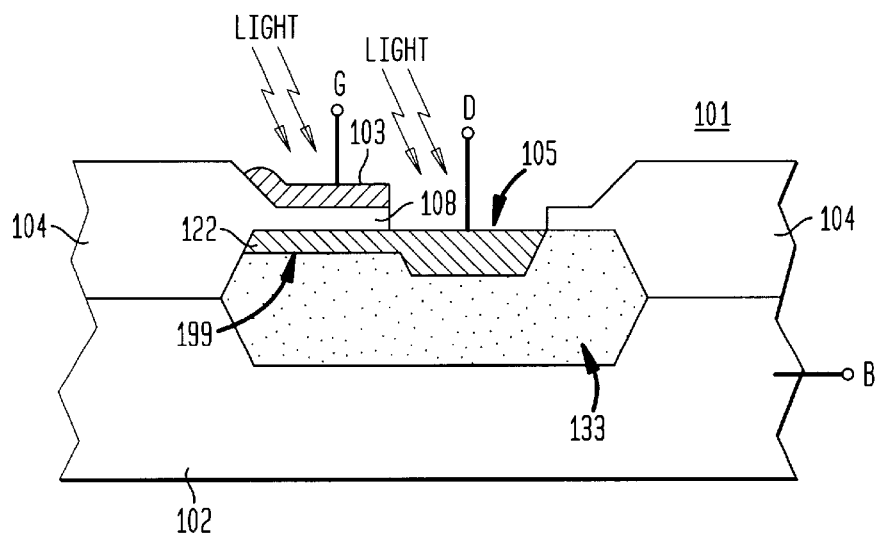
FIG. 1 is a cross section of a photosensing device in accordance with the present invention.

Referring now to FIG. 1, a photosensing device 101 according to the present invention is shown in more detail. The junction diode of the photosensing device 101 of FIG. 1 includes a first electrical side comprising a region of a semiconductor substrate 102 and a second electrical side comprising diffused layer feature 105 that is disposed on a surface of the region of the substrate 102. The MOS capacitor includes a first electrical side comprising a region of the substrate 102, a thin oxide spacer dielectric layer 108 disposed over the region of the substrate 102, and a second electrical side comprised of a light-transparent field plate feature 103 overlaying the thin oxide spacer dielectric layer 108. The field plate feature 103 is typically a polysilicon thin-film layer as commonly used in CMOS technology. During operation, the MOS capacitor may further include an inversion layer feature 122. As a person skilled in the art understands, the inversion layer feature 122 forms under the thin oxide spacer dielectric layer 108 when bias conditions permit. More specifically, the inversion layer feature 122 forms when bias (in the polarity of inversion) across the MOS capacitor exceeds, by an appropriate margin, the threshold voltage of the MOS capacitor plus any bias (i.e., reverse bias) existing across the junction diode.

The diffused layer feature 105 of the junction diode is disposed adjacently to the inversion layer feature 122 that forms when the MOS capacitor is biased into inversion. By virtue of this adjacency, the inversion layer feature 122, when it exists, abuts the diffused layer feature 105 of the junction diode such that the two form a single electrical region disposed above the substrate 102. Moreover, the region of substrate 102 underlying diffused layer feature 105 of the junction diode and the region of substrate 102 underlying the thin oxide spacer dielectric layer 108 of the MOS capacitor are physically contiguous and constitute a single electrical region of the substrate 102. At the option of the designer, this single electrical region of the substrate 102 may be defined by a deep tub diffusion feature 133. The conductivity type of tub feature 133 is preferably the same as the conductivity type of the substrate 102; however, it would not be inconsistent with the scope of the present invention to select a conductivity type for tub feature 133 that is opposite to the conductivity type of the substrate 102. The conductivity type of the diffused layer feature 105 of the junction diode is opposite to the conductivity type of the underlying substrate region defined by deep tub diffusion feature 133, so that a diode junction forms between diffused layer feature 105 and the underlying region of substrate 102 defined by tub feature 133.

A thick oxide ring feature 104 is provided to isolate the device 101 from other semiconductor devices that may be integrated on the same substrate. Using common CMOS techniques, the thick oxide ring feature 104 can be disposed over an underlying deep tub diffusion (channel stop) which further enhances isolation. It should be noted that, in addition to thick oxide ring feature 104, other support features that are common in CMOS technology but which are not explicitly discussed herein, may be advantageously used in the present invention as those skilled in the art will understand. Therefore, the particular embodiments described herein are provided by way of example to illustrate the use of certain CMOS features to implement the present invention.

As shown in FIG. 1, the photosensing device 101 is a three terminal device comprising a body terminal B, a diode terminal D, and a gate terminal G. In particular, the body terminal B serves as a contact to the electrical region of the substrate common to both the first electrical side of the MOS capacitor and to the first electrical side of the junction diode. The gate terminal G serves as a contact to the field plate side of the MOS capacitor. The diode terminal D serves as a contact to the second electrical side of the junction diode. As will be described in more detail, the body terminal B, the diode terminal D, and the gate terminal G are used to apply the appropriate bias potentials to operate the device 101.

The photosensing region of the device 101 is defined by a photojunction 199 that comprises a space charge region of the substrate 102 that forms when the MOS capacitor is biased into inversion or depletion, and a junction space charge region of the junction diode. By virtue of the adjacency of the junction diode and the MOS capacitor, these two space charge regions combine into a contiguous space charge region. When light enters this contiguous space charge region, free electron-hole pairs are generated. The field of the contiguous space charge region causes these electron-hole pairs to separate and drift towards the sources of the field. These electron-hole pairs can consequently act either to reduce the field (e.g., reduce the voltage across the photojunction 199), or to force a current to flow in an external circuit (e.g., a circuit maintaining fixed bias across the photojunction 199). As will be described in more detail below, the structure and operation of the present invention implements the former of these operating alternatives, that being the reduction of the field. As a result, a voltage response is produced rather than a current response. It should be noted that because the voltage response is inversely related to the junction capacitance of the photojunction 199, prior art devices have not been able to effectively scale the voltage response by scaling the area of the photojunction 199. However, in the present invention, this limitation is overcome by using a three-phase operating cycle which will be described hereinafter.

Figure 2:
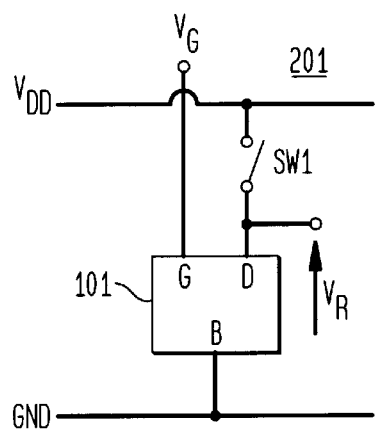
FIG. 2 is a schematic block diagram of an exemplary embodiment of a photo-integrator circuit in accordance with the present invention.

Referring now to FIG. 2, a photo-integrator circuit 201 according to the present invention includes the photosensing device 101 (FIG. 1) connected to a single-pole, single-throw switch SW1. The photo-integrator circuit 201 has an operating cycle that includes three phases, those being a reset phase (i.e., a first phase), an integration phase (i.e., a second phase), and a read-out phase (i.e., a third phase). In operation, at the onset of the reset phase, switch SW1 closes momentarily to connect the diode terminal D of the photosensing device 101 to a first bias source $V_{DD}$. While switch SW1 is closed, a second bias source $V_G$ is applied at the gate terminal G, so that the MOS capacitor is biased into accumulation. The value of $V_G$ for accumulation is represented by the value $V_{G_L}$ (low value). As shown, the body terminal B of photosensing device 101 is connected to ground. The integration phase begins with the transitioning of switch SW1 from a closed to an open position. Immediately after switch SW1 opens, the value of $V_G$ changes to a value $V_{G_H}$ (high value) so that the MOS capacitor is biased into inversion or depletion. The integration phase continues for a predetermined interval of time $T_{IN}$, which represents a photo-integration interval. The read-out phase begins by resetting $V_G$ to value $V_{G_L}$ so that the MOS capacitor is again accumulated. A voltage response of the photosensing device 101, represented as $V_R$, is obtained between the diode terminal D and the body terminal B during the read-out phase immediately after the photo-integrator circuit 201 has settled following the change of the bias source $V_G$.

It should be noted that switch SW1 can be a MOS field effect transistor (MOSFET) that operates in the triode region of its operating characteristic when it turns on. In yet another variation, SW1 can be a MOSFET operating in the saturating region of its characteristic when it turns on, so that the voltage at the diode terminal D is controlled by the voltage applied at a gate terminal of the MOSFET.

Figure 3:
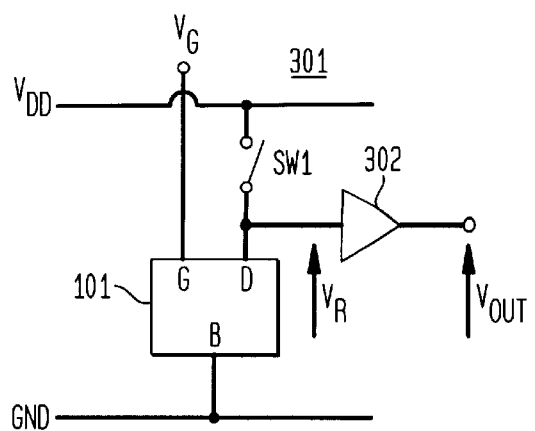
FIG. 3 is a schematic block diagram of another embodiment of the photo-integrator circuit of FIG. 2.

Referring now to FIG. 3, a photo-integrator circuit 301 includes a voltage buffer component 302 in addition to the circuitry of the photo-integrator circuit 201 from FIG. 2. An output of circuit 301, represented as $V_{OUT}$, is defined as the voltage response of the photosensing device 101, $V_R$, as buffered by the voltage buffer component 302. A person skilled in the art will appreciate that during the read-out phase, the response of the device, $V_R$, and consequently $V_{OUT}$, are boosted relative to their respective values at the end of the integration phase. The amount that these values are boosted is determined by a ratio of two different impedance values that occur between the diode terminal D and the body terminal B of the photosensing device 101 as the operating cycle transitions from the integration phase to the read-out phase. This ratio has a value larger than unity because the capacitance of the junction formed between the inversion layer feature 122 of the MOS capacitor and the underlying region of substrate 102 during the integration phase is destroyed during the read-out phase. Signal boosting is achieved as, for all practical purposes, photo-generated charge is not lost when the impedance between the diode terminal D and the body terminal B changes.

Figure 4:
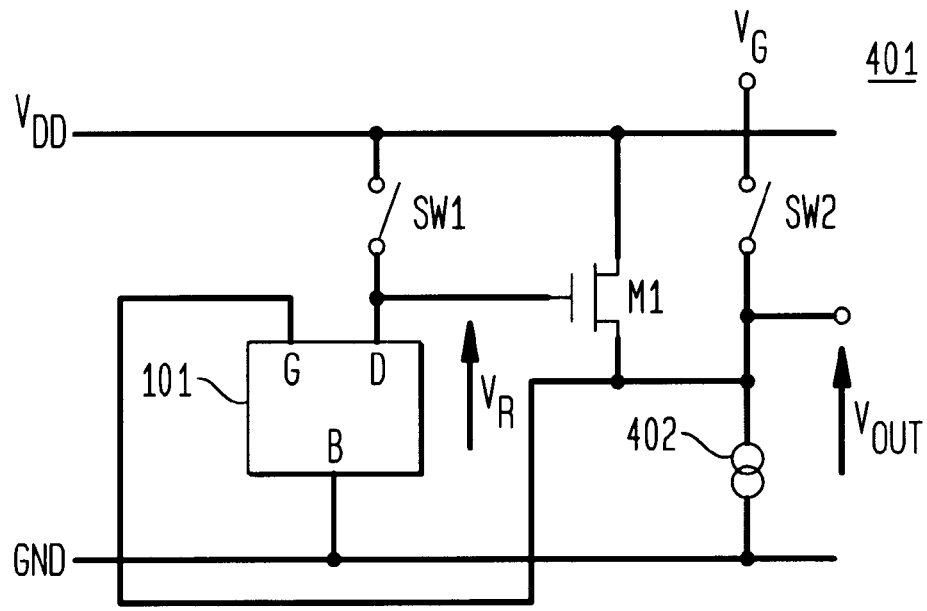
FIG. 4 is a schematic block diagram of another embodiment of the photo-integrator circuit of FIG. 3.

Referring now to FIG. 4, there is shown a photo-integrator circuit 401 according to another embodiment of the present invention. The photo-integrator circuit 401 is a variation of the photo-integrator circuit 301 from FIG. 3, wherein the voltage buffer 302 (FIG. 3) is now implemented as a source follower circuit (FIG. 4). A person familiar with the art will appreciate that the source follower circuit as shown comprises a MOSFET M1 and a current-source load 402. The functionality of a source follower circuit generally and the use of a source follower circuit to configure unity gain voltage buffering is well known in the art.

In the photo-integrator circuit 401, a drain terminal of transistor M1 is connected to bias source $V_{DD}$, although it is to be understood that another appropriate bias source can be used instead. A gate terminal of transistor M1, which is the input terminal of the source follower circuit, is connected to the diode terminal D of the photosensing device 101. The current-source load 402 is connected between a source terminal of transistor M1 and the body terminal B of the photosensing device 101 (i.e., a ground node GND). The output of circuit 401, $V_{OUT}$, is the voltage developing across current-source load 402. Furthermore, the gate terminal G of photosensing device 101 connects to an output node of the photo-integrator circuit 401. The output node also connects to bias supply $V_G$ through a single-pole, single-throw switch SW2.

This particular configuration supplies the bias required between the gate terminal G and the body terminal B of the photosensing device 101 as follows. In a first phase, bias source $V_G$ having a value $V_{G_L}$ (low value), which is required to accumulate the MOS capacitor, is supplied by the output of the photo-integrator circuit 401 (i.e., with switch SW2 in an open position). In a second phase, bias $V_G$ having a value $V_G$ (high value), which is required to invert or deplete the MOS capacitor, is provided by bias source $V_G$ (i.e., with switch SW2 in a closed position). Supplying the bias value $V_{G_L}$ by means of the output of the photo-integrator circuit 401 results in power savings, because at the end of each cycle, the output of photo-integrator circuit 401 assumes a value that is sufficient enough (for that particular cycle) to bias the MOS capacitor into accumulation. By contrast, when supplying this bias with a fixed bias source as in photo-integrator circuits 201 (FIG. 2) and 301 (FIG. 3), the value of the fixed bias source (i.e., $V_{G_L}$) must be set to accumulate the MOS capacitor consistent with the expected extreme device response. Seen out of context, switch SW2 may appear to place the photo-integrator circuit 401 at a disadvantage in terms of area efficiency as compared to photo-integrator circuit 301 (FIG. 3). However, as will be discussed in more detail for photo-integrator circuit 501 in the context of an active pixel sensor array, switch SW2 is shared, and removes the necessity to route the bias source $V_G$ to each array site.

The operation of photo-integrator circuit 401 is similar to that of photo-integrator circuits 201 and 301 during all three phases of the operating cycle, even though the biasing provisions for the photosensing device 101 may differ. Specifically, at the onset of the reset phase, switch SW1 closes momentarily to connect the diode terminal D of the photosensing device 101 to bias source $V_{DD}$. While switch SW1 is in the closed position, switch SW2 opens so that the bias applied at the gate terminal G of the photosensing device 101 is equal to $V_{DD}-V_{ON}$, where $V_{ON}$ is the on-voltage of transistor M1. The integration phase begins on a transition of switch SW1 from the closed to the open position. Immediately following this transition, switch SW2 closes and connects the gate terminal G of the photosensing device 101 to bias supply $V_G$. Switch SW2 may either close momentarily at the beginning of the integration phase and then remain open for the remainder of the phase, or alternatively, SW2 may remain closed until the end of the integration phase. $V_G$ has a permanent value $V_{G_H}$, such that the MOS capacitor is biased into inversion or depletion. The integration phase continues for a predetermined interval of time $T_{IN}$, which is the photo-integration interval. The read-out phase begins by opening switch SW2, thus resulting in biasing the gate terminal G with the output voltage of the photo-integrator circuit 401. The output voltage of the photo-integrator circuit 401 is equal to the voltage at the diode terminal D minus $V_{ON}$. If the MOS capacitor is enhancement type, this output voltage is, by definition, sufficient to bias the MOS capacitor into accumulation. The voltage response of the photosensing device 101, $V_R$ appears between the diode terminal D and the body terminal B during the read-out phase immediately after the photo-integrator circuit 401 has settled following the opening of switch SW2. The output of the photo-integrator circuit 401, $V_{OUT}$, is the voltage developing across the current-source load 402. It will be apparent to a person skilled in the art that this output voltage assumes a value slightly less than $V_R-V_{ON}$.

Figure 5:
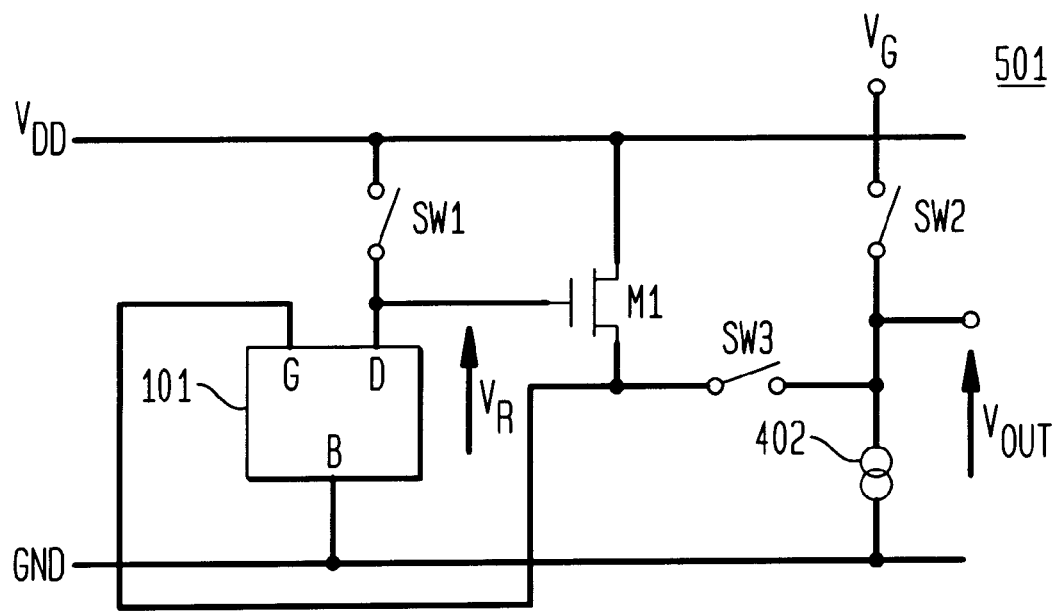
FIG. 5 is a schematic block diagram of another exemplary embodiment of the photo-integrator circuit shown in FIG. 4.

Referring now to FIG. 5, there is shown a photo-integrator circuit 501 according to another embodiment of the present invention. The photo-integrator circuit 501 is similar to the photo-integrator circuit 401 except for an added single-pole, single-throw switch SW3. Switch SW3 splits the output node of circuit 401 into two nodes. The first of the two nodes is common to one side of switch SW3, to the source terminal of transistor M1, and to the gate terminal G of photosensing device 101. The second of the two nodes is common to the other side of switch SW3, the current-source load 402, and one side of switch SW2. The output of photo-integrator circuit 501, $V_{OUT}$, is the voltage developing across the current-source load 402 as was the case in photo-integrator circuit 401.

Photo-integrator circuit 501 is particularly suitable for use in an active pixel sensor imaging (APS) array. For example, when used in the context of the APS array, both the current-source load 402 and the switch SW2 of photo-integrator circuit 501 can be turned into time shared elements of the circuit. Thus, a set of array sites can have distinct instances of switch SW3 and a part of photo-integrator circuit 501 connecting to the left side of switch SW3 (e.g., elements common to the first node). The set of array sites would time share, with all the other members in the set, a part of circuit 501 connecting to the right side of the switch SW3 (e.g., elements common to the second node), including the output node. Typically, a set of array sites includes all of the sites that belong to one column of the array. The sites in a set are sequentially scanned. In the course of a particular scan, one site at a time is connected to the shared part of the circuit by closing one SW3 switch in the set. The scan is timed so that when the particular switch SW3 is in the closed position, the photo-integrator circuit 501, to which that switch belongs, begins the read-out phase (i.e., third phase) of its operating cycle. Once in a closed position, switch SW3 remains closed until both the read-out phase (i.e., third phase) of the current operating cycle and the reset phase (i.e., first phase) of the next operating cycle have completed (for the site to which the switch SW3 belongs). A bus line that "buses" the bias source $V_G$ to the array site is also the line that "buses" the output node of the array site. Consequently, in this configuration, the cost of one bus line is saved. Additionally, the sharing of the current-source load 402 results in both area and power dissipation savings.

It will be apparent to one skilled in the art that, in order to relate the output $V_{OUT}$ to the photo-charge generated by the light entering the photosensing device during an operating cycle, significant further signal processing is required in all of the photo-integrator circuits described herein. For example, correlated double sampling (CDS) techniques need to be employed in order to subtract offsets that are added to the signal by the various components in the signal path and also by the bias voltages. Specifically, in the case of photo-integrator circuit 501, CDS requires a second sampling of the output, which typically is taken during the reset phase (i.e., first phase) of the subsequent operating cycle while the gate terminal G of the photosensing device 101 is connected to the bias source $V_{DD}$. These and other signal processing aspects that are common in the art of APS imagers are to be understood as being compatible with the present invention.

It should be noted that other variations to the described embodiments of the present invention may be necessary to accommodate certain design situations. One such variation arises with respect to the relation of the bias voltage $V_{G_H}$ to the bias voltage $V_{DD}$. As previously described, the MOS capacitor is biased into inversion at the onset of the integration phase (i.e., second phase) of the operating cycle to minimize the dark current response of the device. However, to achieve this biasing may require an impractically high value of $V_{G_H}$, in which case a lesser value of $V_{G_H}$ may be appropriately used to merely cause the MOS capacitor to deplete. In order to invert the MOS capacitor at the onset of the integration phase (i.e., second phase), the voltage difference $V_{G_H}-V_{DD}$ must exceed the threshold voltage of the MOS capacitor by a margin directly dependent on the ratio of MOS capacitor device area to junction diode device area. This ratio is the same ratio used for defining the signal boosting ratio (i.e., gain ratio) of the present invention which was previously described. Consequently, designing for a high boosting ratio may also result in high dark current operation, which is generally undesirable.

The minimum value of $V_{G_H}$ required for inverting the MOS capacitor at the onset of the integration phase of the operating cycle decreases as the threshold voltage of the MOS capacitor decreases. Thus, if the technology offers a low (enhancement) threshold voltage option, the MOS capacitor should be constructed as a low threshold type. More preferably, if the technology offers a depletion threshold option, the MOS capacitor should be constructed as depletion type. It should also be noted that opting for either of these alternatives will improve the dark current performance of the device even if the device cannot be biased into inversion at the onset of the integration phase of the operating cycle. This is so because, for a given value of $V_{G_H}$, either of the above options will advance the onset of MOS capacitor inversion during the integration phase of the operating cycle.

Numerous further modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the device structure and of the circuit topology may be varied substantially without departing from the spirit of the invention and the exclusive use of all modifications which come within the scope of the appended claims is hereby reserved.

What is claimed is:

1. A photo-integrator circuit operable in a first, second, and third phase, said photo-integrator circuit comprising:

a photosensing device including a semiconductor substrate, a junction diode having a first electrical side and a second electrical side, and a Metal-Oxide-Semiconductor (MOS) capacitor having a first electrical side and a second electrical side, said junction diode and said MOS capacitor being adjacently integrated on said substrate, said photosensing device further including a body terminal contacting a region of said substrate, said region being defined by said first electrical side of said junction diode and said first electrical side of said MOS capacitor, a gate terminal contacting said second electrical side of said MOS capacitor, and a diode terminal contacting said second electrical side of said junction diode; and a switch means coupled to said diode terminal of said photosensing device, said MOS capacitor being operable to be biased into a first mode during the first phase, said junction diode being operable to be reverse biased during the first phase, said MOS capacitor being further operable to be biased into a second mode during the second phase, the second phase continuing for a given time interval, said photosensing device being operable to be illuminated during said given time interval, said MOS capacitor being further operable to be biased into said first mode during the third phase, wherein said first mode is an accumulation mode, said photosensing device being operable to generate a voltage response between said diode terminal and said body terminal during the second phase, said photosensing device being further operable to boost said voltage response during the third phase.

2. The photo-integrator circuit according to claim 1, wherein:

said switch means includes an open and a closed position;

said MOS capacitor is responsive to a first voltage signal applied between said gate terminal and said body terminal for biasing into said accumulation mode during the first phase;

said switch means is operable to transition to said closed position during the first phase, said switch means is further operable in said closed position to couple said diode terminal to a second voltage signal, wherein said junction diode is responsive to said second voltage signal applied between said diode terminal and said body terminal for reverse biasing during the first phase;

said switch means is operable to transition to said open position prior to completion of the first phase, wherein said MOS capacitor is responsive to a third voltage signal applied between said gate terminal and said body terminal for biasing into said second mode during the second phase for said given time interval; and wherein said MOS capacitor is responsive to a fourth voltage signal applied between said gate terminal and said body terminal for biasing into said accumulation mode during the third phase.

3. The photo-integrator circuit according to claim 2, wherein said second electrical side of said junction diode comprises a diffused layer disposed on a surface of said region, wherein said MOS capacitor further includes an inversion layer formed during said second mode, and wherein said second electrical side of said junction diode electrically and physically contacts said inversion layer of said MOS capacitor.

4. The photo-integrator circuit according to claim 1, wherein said switch means is a Metal-Oxide-Semiconductor Field Effect Transistor (MOSFET), said MOSFET being operable in a triode region of an operating characteristic.

5. The photo-integrator circuit according to claim 1, wherein said switch means is a Metal-Oxide-Semiconductor Field Effect Transistor (MOSFET) having a source terminal and a gate terminal, said diode terminal of said photosensing device being coupled to said source terminal of said MOSFET, said MOSFET being operable in a saturation region of an operating characteristic, wherein a voltage value at said diode terminal is controlled by a voltage applied at said gate terminal of said MOSFET.

6. The photo-integrator circuit according to claim 3, further comprising a voltage buffer having an input terminal, a reference terminal, and an output terminal, said input terminal being coupled to said diode terminal, said reference terminal being coupled to said body terminal, said voltage buffer being operable to buffer said voltage response of said photosensing device, said voltage buffer being further operable to generate a buffered voltage response at said output terminal.

7. The photo-integrator circuit according to claim 6, wherein said voltage buffer comprises a source follower circuit.

8. The photo-integrator circuit according to claim 7, wherein said source follower circuit includes:

a Metal-Oxide-Semiconductor (MOS) field effect transistor having a source terminal, a drain terminal, and a gate terminal, said gate terminal of said MOS field effect transistor being coupled to said diode terminal of said photosensing device, said source terminal being coupled to said gate terminal of said photosensing device, said drain terminal being coupled to said second voltage signal; and a current-source load coupled between said source terminal of said MOS field effect transistor and said body terminal of said photosensing device, said source follower circuit being operable to be biased by said second voltage signal, and wherein said buffered voltage response has a value equivalent to a voltage value across said current-source load.

9. The photo-integrator circuit according to claim 8, wherein said source-follower circuit is operable to bias said MOS capacitor into said accumulation mode via said output terminal.

10. The photo-integrator circuit according to claim 9, further comprising:

a voltage source; and a second switch means having an open and a closed position, said second switch means being operable in said closed position to couple said voltage source between said gate terminal and said body terminal of said photosensing device, wherein said voltage source is operable to bias said MOS capacitor into said second mode while said second switch means is in said closed position, and wherein a bias voltage of said voltage source is substantially equivalent to said third voltage signal.

11. The photo-integrator circuit according to claim 10, further comprising:
   an output node including a first node portion and a second node portion, said first node portion being common to said source terminal of said MOS field effect transistor and said gate terminal of said photosensing device, said second node portion being common to said current-source load and one side of said second switch means; and
   a third switch means coupled between said first node portion and said second node portion, said third switch means having an open and a closed position, said third switch means being in said open position during the second phase, and said second switch means being in said closed position during the first phase and the third phase.

12. The photo-integrator circuit according to claim 1, wherein said second mode is an inversion mode.

13. The photo-integrator circuit according to claim 1, wherein said second mode is a depletion mode.

14. The photo-integrator circuit according to claim 10, wherein said second mode is an inversion mode.

15. The photo-integrator circuit according to claim 10, wherein said second mode is a depletion mode.

16. An integrated imaging array having a plurality of sets of array sites, each array site comprising:
   a photosensing device including a semiconductor substrate, a junction diode having a first electrical side and a second electrical side, and a Metal-Oxide-Semiconductor (MOS) capacitor having a first electrical side and a second electrical side, said junction diode and said MOS capacitor being adjacently integrated on said substrate, said photosensing device further including a body terminal contacting a region of said substrate, said region being defined by said first electrical side of said junction diode and said first electrical side of said MOS capacitor, a gate terminal contacting said second electrical side of said MOS capacitor, and a diode terminal contacting said second electrical side of said junction diode; and
   a first switch means coupled to said diode terminal of said photosensing device,
   said MOS capacitor being operable to be biased into a first mode during a first phase in response to a first voltage signal applied between said gate terminal and said body terminal,
   said junction diode being operable to be reverse biased during said first phase in response to a second voltage signal applied between said diode terminal and said body terminal,
   said MOS capacitor being further operable to be biased into a second mode during a second phase in response to a third voltage signal applied between said gate terminal and said body terminal, said second phase continuing for a given time interval, said photosensing device being operable to be illuminated during said given time interval,
   said MOS capacitor being further operable to be biased into said first mode during a third phase in response to a fourth voltage signal applied between said gate terminal and said body terminal, wherein said first mode is an accumulation mode,
   said photosensing device being operable to generate a voltage response between said diode terminal and said body terminal during said second phase, said photosensing device being further operable to boost said voltage response during said third phase.

17. The integrated imaging array according to claim 16, further comprising a voltage buffer having an input terminal, a reference terminal, and an output terminal, said input terminal being coupled to said diode terminal, said reference terminal being coupled to said body terminal, said voltage buffer being operable to buffer said voltage response of said photosensing device, said voltage buffer being further operable to generate a buffered voltage response at said output terminal.

18. The integrated imaging array according to claim 17, further comprising:
   a second switch means coupled to said gate terminal of said photosensing device;
   wherein said voltage buffer comprises a source follower circuit, said source follower circuit including
      a Metal-Oxide-Semiconductor (MOS) field effect transistor having a source terminal, a drain terminal, and a gate terminal, said gate terminal of said MOS field effect transistor being coupled to said diode terminal of said photosensing device, said source terminal being coupled to said gate terminal of said photosensing device, said drain terminal being coupled to said second voltage signal, and
      a current-source load coupled between said source terminal of said MOS field effect transistor and said body terminal of said photosensing device;
   said source follower circuit being operable to be biased by said second voltage signal, said source-follower circuit being further operable to bias said MOS capacitor into said accumulation mode via said output terminal, and wherein said buffered voltage response has a value equivalent to a voltage value across said current-source load.

19. The integrated imaging array according to claim 17, wherein said voltage buffer comprises a source follower circuit, said source follower circuit including a Metal-Oxide-Semiconductor (MOS) field effect transistor having a source terminal, a drain terminal, and a gate terminal, said gate terminal of said MOS field effect transistor being coupled to said diode terminal of said photosensing device, said source terminal being coupled to said gate terminal of said photosensing device, said drain terminal being coupled to said second voltage signal, wherein said source follower circuit is operable to be biased by said second voltage signal, and said source-follower circuit is further operable to bias said MOS capacitor into said accumulation mode via said output terminal.

20. The integrated imaging array according to claim 19, wherein each array site in one of said plurality of sets is operable to be sequentially addressed, and wherein each array site in one of said plurality of sets is further operable to time share a single current-source load, said current-source load being coupled between said source terminal of said MOS field effect transistor and said body terminal of said photosensing device.

21. The integrated imaging array according to claim 20, wherein each array site in one of said plurality of sets is further operable to time share a single second switch means, said second switch means being coupled to said gate terminal of said photosensing device.

22. The photo-integrator circuit according to claim 16, wherein said second mode is an inversion mode.

23. The photo-integrator circuit according to claim 16, wherein said second mode is a depletion mode.

24. An integrated imaging array having a plurality of sets of array sites, each array site comprising:
   a photosensing device including a semiconductor substrate, a junction diode having a first electrical side and a second electrical side, and a Metal-Oxide-Semiconductor (MOS) capacitor having a first electrical side and a second electrical side, said junction diode and said MOS capacitor being adjacently integrated on said substrate, said photosensing device further including a body terminal contacting a region of said substrate, said region being defined by said first electrical side of said junction diode and said first electrical side of said MOS capacitor, a gate terminal contacting said second electrical side of said MOS capacitor, and a diode terminal contacting said second electrical side of said junction diode, said MOS capacitor being operable to be biased into a first mode during a first phase, said junction diode being operable to be reverse biased during said first phase, said MOS capacitor being further operable to be biased into a second mode during a second phase, said second phase continuing for a given time interval, said photosensing device being operable to be illuminated during said given time interval, said MOS capacitor being further operable to be biased into said first mode during a third phase, said photosensing device being operable to generate a voltage response between said diode terminal and said body terminal during said second phase, said photosensing device being further operable to boost said voltage response during said third phase;

a first switch means coupled to said diode terminal of said photosensing device;

a source follower circuit including
    a Metal-Oxide-Semiconductor (MOS) field effect transistor having a source terminal, a drain terminal, and a gate terminal, said gate terminal of said MOS field effect transistor being coupled to said diode terminal of said photosensing device, said source terminal being coupled to said gate terminal of said photosensing device, and
    a current-source load coupled between said source terminal of said MOS field effect transistor and said body terminal of said photosensing device,
    said source follower circuit being operable to buffer said voltage response;

a second switch means coupled to said source terminal of said MOS field effect transistor and to said gate terminal of said photosensing device;

an output node comprising a first node portion and a second node portion, said first node portion being common to said source terminal of said MOS field effect transistor and said gate terminal of said photosensing device, said second node portion being common to said current-source load and one side of said second switch means; and a third switch means coupled between said first node portion and said second node portion, wherein each array site in one of said plurality of sets is operable during said first and third phase to be sequentially addressed by closing said third switch means, and wherein each array site in one of said plurality of sets is further operable to time share said second node portion when addressed.

25. The photo-integrator circuit according to claim 24, wherein said first mode is an accumulation mode and said second mode is an inversion mode.

26. The photo-integrator circuit according to claim 24, wherein said first mode is an accumulation mode and said second mode is a depletion mode.

* * * * *